United States Patent
Kimura et al.

(10) Patent No.: US 8,129,889 B2
(45) Date of Patent: Mar. 6, 2012

(54) PIEZOELECTRIC CERAMIC COMPOSITIONS AND PIEZOELECTRIC ELEMENTS

(75) Inventors: Masahiko Kimura, Kusatsu (JP); Kosuke Shiratsuyu, Omihachiman (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 25 days.

(21) Appl. No.: 12/484,609

(22) Filed: Jun. 15, 2009

(65) Prior Publication Data

US 2009/0243440 A1    Oct. 1, 2009

Related U.S. Application Data

(63) Continuation of application No. PCT/JP2007/072761, filed on Nov. 26, 2007.

(30) Foreign Application Priority Data

Dec. 26, 2006   (JP) ................................. 2006-349610

(51) Int. Cl.
*H01L 41/187*   (2006.01)
(52) U.S. Cl. ..................................................... 310/358
(58) Field of Classification Search .................. 310/358; 252/62.9 R, 62.9 PZ
See application file for complete search history.

(56) References Cited

U.S. PATENT DOCUMENTS

| | | | | |
|---|---|---|---|---|
| 3,463,732 A | * | 8/1969 | Hisao et al. | 252/62.9 PZ |
| 5,182,695 A | * | 1/1993 | Handa et al. | 361/321.5 |
| 2008/0036334 A1 | * | 2/2008 | Kawada et al. | 310/358 |
| 2008/0067897 A1 | * | 3/2008 | Nanao et al. | 310/358 |

FOREIGN PATENT DOCUMENTS

| | | | |
|---|---|---|---|
| JP | 63-182255 A | | 7/1988 |
| JP | 1-261876 A | | 10/1989 |
| JP | 11292626 | | 10/1999 |
| JP | 2004161519 | | 6/2004 |
| WO | WO 2006/035794 | * | 4/2006 |
| WO | WO2006112096 | | 10/2006 |

* cited by examiner

*Primary Examiner* — Derek Rosenau
(74) *Attorney, Agent, or Firm* — Dickstein Shapiro LLP

(57) ABSTRACT

A piezoelectric ceramic composition includes a main component represented by general formula $\{(Pb_{1-x-y}Ca_xSr_y)\{Ti_{1-z}(Ni_{1/3}Nb_{2/3})_z\}O_3\}$, wherein $0 \leq x \leq 0.2$ (preferably $0 \leq x \leq 0.15$), $0 \leq y \leq 0.2$ (preferably $0 \leq y \leq 0.1$), $0.05 \leq x+y \leq 0.2$, and $0.02 \leq z \leq 0.1$. Furthermore, a Mn component is preferably present in an amount of 1.0 part by weight or less (excluding zero) (more preferably 0.05 to 1.0 part by weight) in terms of $MnCO_3$ with respect to 100 parts by weight of the main component. A piezoelectric element includes a piezoelectric ceramic body composed of this piezoelectric ceramic composition. Firing can be performed at a low temperature of about 1,100° C. The piezoelectric element has a high Curie point Tc, can withstand solder reflow treatment, and achieves satisfactory piezoelectric properties.

20 Claims, 1 Drawing Sheet

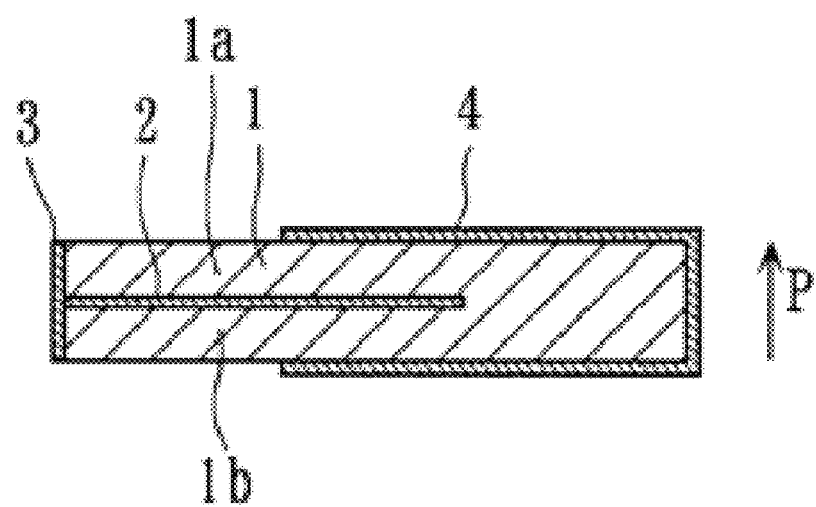

PIEZOELECTRIC CERAMIC COMPOSITIONS AND PIEZOELECTRIC ELEMENTS

This is a continuation of application Serial No. PCT/JP2008/072761, filed Nov. 26, 2009.

TECHNICAL FIELD

The present invention relates to piezoelectric ceramic compositions and piezoelectric elements, and more specifically, to a piezoelectric ceramic composition mainly containing a lead titanate-based ceramic composition and a piezoelectric element including the piezoelectric ceramic composition.

BACKGROUND ART

Lead titanate ($PbTiO_3$) which has a perovskite structure (general formula $ABO_3$) and is a ferroelectric material, shows piezoelectricity and is thus suitable for a piezoelectric material. It is difficult to form a strong ceramic (sintered body) having only a small number of pores and composed of lead titanate. Thus, dense piezoelectric ceramic compositions have been investigated and developed by partially substituting Pb and Ti by other elements and adding various components. The piezoelectric ceramic compositions are being practically applied to piezoelectric elements such as piezoelectric ceramic resonators.

For example, Patent Document 1 discloses a piezoelectric ceramic composition in which the PbO content is 42 to 48.5 mol %, $TiO_2$ content is 43 to 52 mol %, the total molar amount of $La_2O_3$ and at least one of SrO, CaO, and BaO is 2.5 to 8 mol %, the $MnO_2$ content of 0.1 to 2.0 mol %, and the proportion of at least one perovskite compound selected from $Pb(Nb_{1/2}Fe_{1/2})O_3$, $Pb(Nb_{1/2}Co_{1/2})O_3$, and $Pb(Ni_{1/2}Nb_{1/2})O_3$ is 3 mol % or less.

In Patent Document 1, the partial substitution of Pb in $PbTiO_3$ by any one of Sr, Ca, and Ba and the partial substitution of Ti by Mn and a third component such as ($Ni_{1/2}Nb_{1/2}$) can eliminate defective dispersion occurring during production and expand the allowable range of production conditions, so that it is possible to stably supply the ceramic material with a uniform composition.

Patent Document 2 discloses a pyroelectric ceramic composition containing a main component composed of a compound having a composition represented by general formula $(Pb_{1-x}Ca_x)[(Ni_{1/3}Nb_{2/3})_yTi_{1-y}]O_3$ (wherein x and y satisfy $0.25 \leq x \leq 0.35$ and $0.01 \leq y \leq 0.06$) and containing 0.3 to 2.5 at % Mn as an auxiliary component.

In Patent Document 2, a pyroelectric ceramic composition with a Curie point Tc of 195° C. to 290° C. is provided by performing firing at a relatively low temperature of 1,100° C. to 1,200° C.

[Patent Document 1] Japanese Unexamined Patent Application Publication No. 63-182255 (claim 1; page (3), upper right column, line 5; and page (4), lower left column, lines 1 to in the same column on the same page)

[Patent Document 2] Japanese Unexamined Patent Application Publication No. 1-261876 (claim 1; page (3), upper left column, lines 5 to 7 in the same column on the same page; and Table 1)

DISCLOSURE OF INVENTION

Problems to be Solved by the Invention

Although the piezoelectric ceramic composition having the composition of Patent Document 1 can expand allowable range of production conditions, the firing temperature is as high as 1,220° C. to 1,280° C. Thus, an expensive high-melting point metal must be used, disadvantageously increasing the production cost.

With respect to the types of piezoelectric element, a multilayer piezoelectric element including internal electrodes provided in a piezoelectric ceramic body is widely used. It is efficient to produce such a multilayer element by alternately stacking ceramic layers and conductive layers and co-firing the ceramic layers and the conductive layers.

In general, high-melting-point metals are expensive. A relatively inexpensive metal material such as Ag having a low-melting point is preferably used. Thus, it is necessary to reduce the firing temperature of the piezoelectric ceramic composition to co-fire a piezoelectric ceramic composition with a low-melting-point metal material such as Ag. For example, in the case of using an Ag—Pd alloy as an internal electrode material, a proportion of Ag, which is relatively inexpensive, of 70% or more is effective in reducing the cost. To achieve this, it is necessary to reduce the firing temperature of the piezoelectric ceramic composition to about 1,100° C.

However, the firing in Patent Document 1 needs to be performed at a high temperature of 1,220° C. to 1,280° C. In the case of using a Ag—Pd alloy as the internal electrode material, for example, the proportion of Pd, which is a high-melting-point noble metal, must be increased to 70% or more, thus increasing the material cost.

In Patent Document 2, firing is performed at 1,100° C. to 1,200° C. Thus, firing can be performed at a low temperature compared with Patent Document 1. However, piezoelectric properties are not described therein. It is unclear whether desired piezoelectric properties are achieved when the pyroelectric ceramic composition described in Patent Document 2 is applied to a piezoelectric element.

Furthermore, the pyroelectric ceramic composition described in Patent Document 2 has a low Curie point of 195° C. to 290° C., which is less than 300° C. Thus, the piezoelectric element may not withstand solder reflow heat treatment, in particular, lead-free solder reflow heat treatment where the pyroelectric ceramic composition is used for a piezoelectric element.

That is, piezoelectric elements are commonly mounted on substrates using solder reflow heat treatment. Furthermore, piezoelectric elements are each required to have a high Curie point Tc that can withstand the reflow heat treatment because polarization disappears at a temperature exceeding the Curie point Tc and piezoelectricity is not exhibited.

Furthermore, switching from lead solder to lead-free solder has been demanded in recent years from an environmental point of view. Such lead-free solder generally has a higher melting point than lead-containing solder. Thus, the piezoelectric elements are required to have higher heat resistance.

However, the Curie point Tc is less than 300° C. in Patent Document 2. It is difficult to withstand solder reflow heat treatment, in particular, lead-free solder reflow heat treatment. Even if the piezoelectric properties before the reflow treatment are good, the piezoelectric properties may be significantly degraded after the reflow treatment.

In consideration of the situation described above, it is an object of the present invention to provide a piezoelectric ceramic composition which can be fired at a low temperature, which has a high Curie point Tc that can sufficiently withstand reflow heat treatment, and which has satisfactory piezoelectricity, and to provide a piezoelectric element including the piezoelectric ceramic composition.

Means for Solving the Problems

To achieve the object, a piezoelectric ceramic composition according to the present invention includes a main component represented by general formula $\{(Pb_{1-x-y}Ca_xSr_y)\{Ti_{1-z}(Ni_{1/3}Nb_{2/3})_z\}O_3\}$, wherein x, y, and z satisfy $0 \leq x \leq 0.2$, $0 \leq y \leq 0.2$, $0.05 \leq x+y \leq 0.2$, and $0.02 \leq z \leq 0.1$.

In the piezoelectric ceramic composition of the present invention, x and y may satisfy $0.05 \leq x \leq 0.15$ and $0 \leq y \leq 0.15$.

The piezoelectric ceramic composition of the present invention may further include a Mn component in an amount of 1.0 part by weight or less (excluding zero) in terms of $MnCO_3$ with respect to 100 parts by weight of the main component.

In the piezoelectric ceramic composition of the present invention, the Mn component is preferably contained in an amount of 0.05 to 1.0 part by weight in terms of $MnCO_3$ with respect to 100 parts by weight of the main component.

A piezoelectric element according to the present invention includes a piezoelectric ceramic body, an internal electrode embedded in the piezoelectric ceramic body, and an external electrode arranged on the piezoelectric ceramic body, in which the piezoelectric ceramic body is composed of any one of the piezoelectric ceramic compositions described above.

In the piezoelectric element of the present invention, the internal electrode is preferably composed of a Ag—Pd alloy.

ADVANTAGES

According to the piezoelectric ceramic composition, the main component is represented by general formula $\{(Pb_{1-x-y}Ca_xSr_y)\{Ti_{1-z}(Ni_{1/3}Nb_{2/3})_z\}O_3\}$, x, y, and z satisfying $0 \leq x \leq 0.2$ (preferably, $0.05 \leq x \leq 0.15$), $0 \leq y \leq 0.2$ (preferably, $0 \leq y \leq 0.15$), $0.05 \leq x+y \leq 0.2$, and $0.02 \leq z \leq 0.1$. Thus, firing can be performed at a low temperature of about 1,100° C. The piezoelectric ceramic composition has a high Curie point of 320° C. or higher that can sufficiently withstand reflow heat treatment and has satisfactory piezoelectricity.

Since firing can be performed at a low temperature of about 1,100° C., the amount of a high-melting-point noble metal such as Pd or Pt as an internal electrode material can be reduced. For example, it is possible to use an inexpensive Ag—Pd conductive material mainly containing Ag, which has a relatively low melting point.

Furthermore, a high Curie point Tc of 320° C. or higher can be ensured. It is thus possible to provide the piezoelectric ceramic composition that can also withstand lead-free solder reflow heat treatment and can maintain satisfactory piezoelectric properties after the reflow heat treatment.

Moreover, the Mn component can be contained in an amount of 1.0 part by weight or less (excluding zero) (preferably, 0.05 to 1.0 part by weight) in terms of $MnCO_3$ with respect to 100 parts by weight of the main component. It is thus possible to provide the piezoelectric ceramic composition having a significantly improved mechanical quality factor Qm.

Furthermore, an internal electrode is embedded in the piezoelectric ceramic body in a piezoelectric element according to the present invention including the piezoelectric ceramic body, and an external electrode arranged on the piezoelectric ceramic body, the piezoelectric ceramic body being composed of any one of the piezoelectric ceramic compositions described above. It is thus possible to perform co-firing at a low temperature of about 1,100° C. even when a low-melting-point metal is used, thereby reducing the production cost.

Moreover, the piezoelectric element has a high Curie point Tc of 320° C. or higher and can withstand lead-free solder reflow heat treatment. It is thus possible to provide a piezoelectric element in which the piezoelectric properties are not degraded even when reflow heat treatment is performed.

Furthermore, the internal electrode can be composed of a Ag—Pd alloy. It is thus possible to provide the piezoelectric element having excellent heat resistance and satisfactory piezoelectric properties even when co-firing is performed at a low temperature of 1,100° C. Specifically, it is possible to produce the piezoelectric element at low cost, the piezoelectric element having satisfactory piezoelectricity: the Curie point Tc is 320° C. or higher, the electromechanical coupling factor k in the longitudinal oscillation in the thickness direction is 30% or more, and the mechanical quality factor Qm is 45 or more, and the piezoelectric element having satisfactory temperature characteristics: the temperature coefficient of a resonant frequency |frTC| is 75 ppm/° C. or less in a temperature range of −20° C. to +80° C. relative to +20° C.

In particular, where the Mn component is contained in an amount of 0.05 to 1.0 part by weight (preferably, 0.05 to 1.0 part by weight) in terms of $MnCO_3$ with respect to 100 parts by weight of the main component, it is possible to produce the piezoelectric element having a significantly improved mechanical quality factor Qm.

BRIEF DESCRIPTION OF DRAWINGS

FIG. 1 is a longitudinal sectional view of a piezoelectric resonator serving as a piezoelectric element according to an embodiment of the present invention.

REFERENCE NUMERALS

1 ceramic body 1
2 internal electrode 2
3 external electrode 3
4 external electrode 4

BEST MODES FOR CARRYING OUT THE INVENTION

Embodiments of the present invention will be described in detail below.

A piezoelectric ceramic composition according to an embodiment of the present invention has a main component represented by general formula (A).

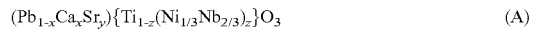

$(Pb_{1-x-y}Ca_xSr_y)\{Ti_{1-z}(Ni_{1/3}Nb_{2/3})_z\}O_3$     (A)

wherein the molar amounts x, y, and z satisfy expressions (1) to (4).

$0 \leq x \leq 0.2$     (1)

$0 \leq y \leq 0.2$     (2)

$0.05 \leq x+y \leq 0.2$     (3)

$0.02 \leq z \leq 0.1$     (4)

That is, the piezoelectric ceramic composition mainly contains a $PbTiO_3$-based complex oxide having a perovskite structure (general formula $ABO_3$). Pb, which is an A-site component, is partially substituted by at least one of Ca and Sr. Ti, which is a B-site component, is partially substituted by $(N_{1/3}Nb_{2/3})$.

In the case where general formula (A) satisfies expressions (1) to (4), firing at a low temperature of about 1,100° C. can be performed to provide a piezoelectric ceramic composition having a high Curie point Tc of 320° C. or higher, which can sufficiently withstand solder reflow heat treatment, and having satisfactory piezoelectricity.

The reason the molar amounts, i.e., x, y, and z, of the main component are limited to ranges defined by expressions (1) to (4) will be described below.

(1) Molar Amounts x and y

By partially substituting Pb occupying the A site by at least one of Ca and Sr, combined with the amounts of Ti and ($Ni_{1/3}Nb_{2/3}$) occupying the B site, firing at a low temperature of about 1,100° C. can be performed, thereby providing a piezoelectric ceramic composition having a high Curie point Tc of 320° C. or higher and satisfactory piezoelectricity.

Where any one of the molar amount of Ca, x, the molar amount of Sr, y, and the sum of both the molar amount (hereinafter, referred to as "the sum of the molar amounts"), (x+y), exceeds 0.2, however, the Curie point Tc is reduced to less than 320° C., the resulting composition may not withstand reflow heat treatment, in particular, lead-free solder reflow heat treatment.

In contrast, in the case where the sum of the molar amounts, (x+y), is less than 0.05 even if Ca and Sr are contained in the A site, an excessively low total content of Ca and Sr results in an excessively high ratio of the length of the c-axis to the length of the a-axis, c/a, leading to destabilization. After sintering, thus, the resulting sintered body may collapse with time.

In this embodiment, therefore, the constituents are mixed in such a manner that the molar amounts x of Ca, the molar amounts y of Sr, and the sum of the molar amounts (x+y) on the A site are $0 \leq x \leq 0.2$, $0 \leq y \leq 0.2$, and $0.05 \leq x+y \leq 0.2$, respectively.

To provide a more satisfactory temperature characteristic of the resonant frequency, the constituents are mixed in such a manner that the molar amounts x and y satisfy $0.05 \leq x \leq 0.15$ and $0 \leq y \leq 0.15$.

(2) Molar Amount z

By partially substituting Ti occupying the B site by ($Ni_{1/3}Nb_{2/3}$), combined with the amounts of Pb and Ca and/or Sr, firing at a low temperature of about 1,100° C. can be performed, thereby providing a piezoelectric ceramic composition having a high Curie point Tc of 320° C. or higher, and satisfactory piezoelectricity.

Where the molar amount z of ($Ni_{1/3}Nb_{2/3}$) exceeds 0.1, however, the Curie point Tc is reduced to less than 320° C., and the resulting composition may not withstand reflow heat treatment, in particular, lead-free solder reflow heat treatment.

Where the molar amount z of ($Ni_{1/3}Nb_{2/3}$) is less than 0.02, sinterability is reduced when firing is performed at a low temperature of about 1,100° C. because of an excessively low amount of ($Ni_{1/3}Nb_{2/3}$). Thus, the insulation resistance is reduced to cause difficulty when performing a polarization treatment.

In this embodiment, therefore, constituents are mixed in such a manner that the molar amount z of ($Ni_{1/3}Nb_{2/3}$) on the B site satisfies $0.02 \leq z \leq 0.1$.

If general formula (A) satisfies expressions (1) to (4), various additional components may be contained, as needed. In particular, Mn is preferably added to the main component from the viewpoint of further improving the mechanical quality factor Qm.

In this case, however, the Mn content needs to be controlled to 1.0 part by weight or less (excluding zero) and preferably 0.05 to 1.0 part by weight in terms of $MnCO_3$ with respect to 100 parts by weight of the main component.

That is, the addition of Mn further improves the mechanical quality factor Qm. To efficiently provide the effect of the addition, 0.05 parts by weight or more of Mn in terms of $MnCO_3$ is preferably contained with respect to 100 parts by weight of the main component.

Where more than 1.0 part by weight of Mn is contained in terms of $MnCO_3$ with respect to 100 parts by weight of the main component, the mechanical quality factor Qm is not improved and may be reduced.

Where Mn is contained in the main component, it is necessary to control the amount of added Mn to 1.0 part by weight or less (excluding zero) and preferably 0.05 to 1.0 part by weight in terms of $MnCO_3$ with respect to 100 parts by weight of the main component.

A piezoelectric element including the piezoelectric ceramic composition will be described below.

FIG. 1 is a longitudinal sectional view of a piezoelectric resonator as an example of a piezoelectric element.

The piezoelectric resonator includes an internal electrode 2 embedded in a piezoelectric ceramic body 1 composed of the piezoelectric ceramic composition described above, the internal electrode 2 being composed of a low-melting-point metal material (e.g., a Ag—Pd alloy with a Ag content of 70% or more), and external electrodes 3 and 4 arranged on surfaces of the piezoelectric ceramic body 1.

The piezoelectric ceramic body 1 includes two piezoelectric ceramic portions 1a and 1b. The internal electrode 2 is arranged so as to cover more than half the surface of the piezoelectric ceramic portion 1b and in such a manner that an end of the internal electrode 2 is exposed at a surface. The piezoelectric ceramic portion 1a is stacked on the internal electrode 2 and the piezoelectric ceramic portion 1b and integrated. The external electrode 3, which is one of the external electrodes, is arranged on one side face of the piezoelectric ceramic body 1 so as to be electrically connected to the internal electrode 2. The external electrode 4, which is the other external electrode, is arranged on both main surfaces in such a manner that the external electrode 4 partially faces the internal electrode 2 and the external electrode 4 arranged on each of the main surfaces is electrically connected through the other side face.

The piezoelectric ceramic body 1 is polarized in the direction indicated by arrow P. The application of a voltage across the external electrodes 3 and 4 generates an electric field between the internal electrode 2 and the external electrode 4, so that the piezoelectric ceramic body 1 functions as a piezoelectric resonator using the second harmonic of a longitudinal oscillation mode in the thickness direction.

A method for producing the piezoelectric resonator described above will be described below.

A Pb-containing Pb compound, a Ca-containing Ca compound, a Sr-containing Sr compound, a Ti-containing Ti compound, a Ni-containing Ni compound, a Nb-containing Nb compound, and, as needed, a Mn-containing Mn compound are prepared as ceramic raw materials.

The ceramic raw materials are weighed in such a manner that general formula (A) satisfies expressions (1) to (4). The Mn compound is weighed in an amount of 1.0 part by weight or less with respect to 100 parts by weight of the main component, as needed. Then these weighed raw materials are placed in a ball mill containing grinding media composed of partially stabilized zirconia and sufficiently subjected to wet mixing with a solvent such as deionized water or ethanol to form a slurry. In this case a dispersant such as polycarboxylic acid is preferably added to achieve a more uniform mixed state.

After drying the slurry, the dried slurry is subjected to calcination in an oxidative atmosphere at 800° C. to 1,000° C. to form calcined matter. After disaggregating the resulting calcined matter, an organic binder composed of, for example, a poly(vinyl alcohol) resin is added to the calcined matter. The mixture is placed in the ball mill containing the grinding media and sufficiently wet-pulverized to form a slurry.

Next, the resulting slurry is subjected to a forming process such as a doctor blade process to form ceramic green sheets.

A conductive paste containing a conductive material, such as Ag—Pd, having a Ag content of 70% or more is prepared. The conductive paste is applied on part of one ceramic green sheet to form a conductive layer. Then another ceramic green sheet without a conductive layer is placed on the upper surface of the one ceramic green sheet and press-bonded to form a ceramic green body. The ceramic green body is fired at about 1,100° C. to afford a ceramic sintered body.

Both surfaces of the ceramic sintered body are subjected to sputtering with a Ag target to form electrodes for polarization treatment. The polarization treatment is performed by applying a predetermined DC voltage across the main surfaces in insulating oil at 150° C. Then the electrodes used for the polarization treatment are removed by etching, thereby providing the piezoelectric ceramic body 1 in which the internal electrode 2 is embedded.

Next, the piezoelectric ceramic body 1 is appropriately cut in such a manner that the internal electrode 2 is located at a predetermined position. Then the resulting piezoelectric ceramic body 1 is subjected to sputtering with the Ag target to form the external electrode 3 and the external electrode 4 on both the main surfaces. Thereby, a piezoelectric resonator is produced.

With respect to the piezoelectric resonator, the piezoelectric ceramic body 1 (piezoelectric ceramic portions 1a and 1b) is composed of the piezoelectric ceramic composition and thus can be co-fired with a low-melting-point metal material at a low temperature of about 1,100° C., thereby resulting in the production of the piezoelectric resonator at low cost. Furthermore, the resulting piezoelectric resonator has a high Curie point Tc of 320° C. or higher and thus can withstand lead-free solder reflow heat treatment.

The piezoelectric resonator has satisfactory piezoelectricity with an electromechanical coupling factor k of 30% or more and mechanical quality factor Qm of 45 or more. With respect to temperature characteristics of the resonant frequency |frTC| can be suppressed to 75 ppm/° C. or less in a temperature range of −20° C. to +80° C. relative to +20° C. That is, satisfactory piezoelectric properties are provided.

The present invention is not limited to the foregoing embodiments. For example, trace amounts of Fe, Cl, Si, Al, and other elements as incidental impurities may be contained within a range in which the characteristics of the present invention are not impaired.

The Ag—Pd alloy is a representative material as an inexpensive low-melting-point material that can be co-fired at about 1,100° C. If desired piezoelectric properties and temperature characteristics are ensured, a low-melting-point material other than the Ag—Pd alloy may be used.

The Pb compound, the Ca compound, the Sr compound, the Ti compound, the Ni compound, the Nb compound, and other compounds, which are the ceramic raw materials, may be carbonates, hydroxides, and oxides.

In the embodiments described above, the piezoelectric ceramic portions 1a and 1b is formed by a sheet process. Alternatively, the piezoelectric ceramic portions 1a and 1b may be formed by a press forming process.

Furthermore, the piezoelectric resonator is exemplified as the piezoelectric element in the foregoing embodiments. The same is true for piezoelectric actuators, piezoelectric filters, piezoelectric buzzers, and piezoelectric sensors.

Examples of the present invention will be specifically described below.

EXAMPLE 1

$Pb_3O_4$, $CaCO_3$, $SrCO_3$, $TiO_2$, NiO, and $Nb_2O_3$ were prepared as ceramic raw materials.

The ceramic raw materials were weighed in such a manner that the final composition had a component composition shown in Table 1. The weighed materials were placed in a ball mill containing partially stabilized zirconia media and subjected to wet mixing with deionized water as a solvent for about 16 hours to form a slurry.

After drying the slurry, the dried slurry is subjected to calcination in an oxidative atmosphere at 900° C. to form calcined matter. After disaggregating the resulting calcined matter, a poly(vinyl alcohol) resin serving as an organic binder was added to the calcined matter. The mixture is placed in the ball mill containing the partially stabilized zirconia media and wet-pulverized for about 16 hours to form a slurry. The slurry was formed into sheets by a doctor blade process, thereby providing 50-μm-thick ceramic green sheets.

A conductive paste with a ratio of the Ag content to the Pd content, i.e., a Ag/Pd weight ratio, of 7/3 was prepared. The conductive paste was applied on part of one of the ceramic green sheets to form a conductive layer. Then the ceramic green sheet was stacked on another ceramic green sheet without a conductive layer in a predetermined order and press-bonded, thereby forming a ceramic green body having a thickness such that the thickness after firing was 0.4 mm. The resulting ceramic green body was fired at 1,100° C. In this way, ceramic sintered bodies of samples 1 to 24 and 27 to 29 were produced.

In addition, a conductive paste with a ratio of the Ag content to the Pd content, i.e., a Ag/Pd weight ratio, of 3/7 was prepared. Ceramic green bodies were formed using the conductive paste in the same way as above and fired 1,150° C. and 1,200° C. to form ceramic sintered bodies of samples 25 and 26.

Both main surfaces of each of the ceramic sintered bodies of samples 1 to 29 were subjected to sputtering with a Ag target to form electrodes for a polarization treatment. The polarization treatment was performed by applying a DC voltage of 5 kV/mm across the main surfaces in insulating oil at 150° C. for 60 minutes. The electrodes for polarization treatment were removed by etching, thereby piezoelectric ceramic bodies.

Next, each of the piezoelectric ceramic bodies was cut into a piece having a length of 5 mm, a width of 1 mm, and a thickness of 0.4 mm in such a manner that the internal electrode was located at a predetermined position. Each of the resulting pieces was subjected to sputtering with the Ag target to form external electrodes as shown in FIG. 1. Thereby, piezoelectric resonators of samples 1 to 29 were produced.

For each of samples 1 to 29, the sintered density, the electromechanical coupling factor k in the longitudinal oscillation in the thickness direction, the mechanical quality factor Qm, the Curie point Tc, and the temperature coefficient of the resonant frequency |frTC| were measured.

The sintered density was measured by the Archimedes method.

The electromechanical coupling factor k and the mechanical quality factor Qm were determined by measuring the resonant frequency fr and antiresonant frequency fa by the resonance-antiresonance method with an impedance analyzer (HP4194A, manufactured by Agilent Technologies, Inc.) and making calculations from the measurements.

The temperature characteristics of the electromechanical coupling factor k were measured. The temperature when the electromechanical coupling factor k became zero with increasing temperature, i.e., the temperature at which piezoelectricity disappeared, was determined and defined as the Curie point Tc.

The temperature coefficient of the resonant frequency |frTC| was determined using equation (1).

$$|frTC| = |\{(f_{80} - f_{-20})/f_{20}\} \times 100|  \qquad (1)$$

where $f_{80}$, $f_{-20}$, and $f_{20}$ are resonant frequencies measured at 80° C., −20° C., and 20° C., respectively.

Table 1 shows compositions and firing temperatures of samples 1 to 29. Table 2 shows the measurement results. In these tables, samples marked with an asterisk (*) are outside the scope of the invention.

TABLE 1

| | $(Pb_{1-x-y}Ca_xSr_y)\{Ti_{1-z}(Ni_{1/3}Nb_{2/3})_z\}O_3$ | | | | Firing temperature |
|---|---|---|---|---|---|
| Sample | x | y | x + y | z | (° C.) |
| 1* | 0.00 | 0.00 | 0.00 | 0.00 | 1100 |
| 2* | 0.02 | 0.00 | 0.02 | 0.05 | 1100 |
| 3 | 0.05 | 0.00 | 0.05 | 0.05 | 1100 |
| 4 | 0.15 | 0.00 | 0.15 | 0.05 | 1100 |
| 5 | 0.18 | 0.00 | 0.18 | 0.05 | 1100 |
| 6 | 0.20 | 0.00 | 0.20 | 0.05 | 1100 |
| 7* | 0.25 | 0.00 | 0.25 | 0.05 | 1100 |
| 8* | 0.00 | 0.02 | 0.02 | 0.05 | 1100 |
| 9 | 0.00 | 0.05 | 0.05 | 0.05 | 1100 |
| 10 | 0.00 | 0.15 | 0.15 | 0.05 | 1100 |
| 11 | 0.00 | 0.18 | 0.18 | 0.05 | 1100 |
| 12 | 0.00 | 0.20 | 0.20 | 0.05 | 1100 |
| 13* | 0.00 | 0.25 | 0.25 | 0.05 | 1100 |
| 14* | 0.02 | 0.02 | 0.04 | 0.05 | 1100 |
| 15 | 0.05 | 0.05 | 0.10 | 0.05 | 1100 |
| 16 | 0.05 | 0.10 | 0.15 | 0.05 | 1100 |
| 17 | 0.05 | 0.15 | 0.20 | 0.05 | 1100 |
| 18* | 0.05 | 0.20 | 0.25 | 0.05 | 1100 |
| 19 | 0.10 | 0.05 | 0.15 | 0.05 | 1100 |
| 20 | 0.10 | 0.10 | 0.20 | 0.05 | 1100 |
| 21* | 0.10 | 0.15 | 0.25 | 0.05 | 1100 |
| 22 | 0.15 | 0.05 | 0.20 | 0.05 | 1100 |
| 23* | 0.15 | 0.10 | 0.25 | 0.05 | 1100 |
| 24* | 0.10 | 0.10 | 0.20 | 0.01 | 1100 |
| 25* | 0.10 | 0.10 | 0.20 | 0.01 | 1150 |
| 26* | 0.10 | 0.10 | 0.20 | 0.01 | 1200 |
| 27 | 0.10 | 0.10 | 0.20 | 0.02 | 1100 |
| 28 | 0.10 | 0.10 | 0.20 | 0.10 | 1100 |
| 29* | 0.10 | 0.10 | 0.20 | 0.15 | 1100 |

TABLE 2

| Sample | Sintered density ($\times 10^3$ kg/m$^3$) | Electrochemical coupling factor (%) | Mechanical quality factor Qm (-) | Curie point Tc (° C.) | Temperature coefficient at resonant frequency \|frTC\| (ppm/° C.) |
|---|---|---|---|---|---|
| 1* | | Unmeasurable | | | |
| 2* | | Unmeasurable | | | |
| 3 | 6.0 | 32 | 59 | 420 | 38 |
| 4 | 6.1 | 34 | 65 | 380 | 5 |
| 5 | 6.2 | 40 | 60 | 360 | 40 |
| 6 | 5.8 | 38 | 62 | 340 | 47 |
| 7* | 5.7 | 36 | 60 | 280 | 110 |
| 8* | | Unmeasurable | | | |
| 9 | 6.0 | 34 | 60 | 420 | 60 |
| 10 | 6.1 | 36 | 65 | 390 | 62 |
| 11 | 6.2 | 36 | 70 | 360 | 70 |
| 12 | 6.0 | 36 | 45 | 330 | 73 |
| 13* | 5.9 | 32 | 52 | 280 | 80 |
| 14* | | Unmeasurable | | | |
| 15 | 6.1 | 34 | 65 | 400 | 20 |
| 16 | 6.3 | 37 | 75 | 380 | 24 |
| 17 | 6.2 | 35 | 88 | 320 | 28 |
| 18* | 5.9 | 35 | 45 | 280 | 36 |
| 19 | 6.2 | 39 | 70 | 380 | 28 |
| 20 | 6.1 | 39 | 75 | 320 | 10 |
| 21* | 6.0 | 40 | 68 | 280 | 25 |
| 22 | 6.0 | 38 | 80 | 320 | 35 |
| 23* | 5.9 | 38 | 45 | 270 | 60 |
| 24* | 4.9 | | Unmeasurable | | |
| 25* | 5.7 | 13 | 75 | 340 | 15 |
| 26* | 6.4 | 34 | 65 | 330 | 18 |
| 27 | 6.0 | 38 | 74 | 330 | 20 |
| 28 | 6.1 | 40 | 65 | 320 | 28 |
| 29* | 6.1 | 36 | 75 | 250 | 30 |

After the formation of sample 1, it collapsed with time since the piezoelectric ceramic composition was composed of $PbTiO_3$. Thus, the characteristics could not be measured. The reason for this is probably that $PbTiO_3$ is tetragonal at normal temperature and thus the ratio of the length of the c-axis to the length of the a-axis, c/a, is excessively high, leading to destabilization.

In each of samples 2 to 23, the molar amount z of ($Ni_{1/3}$ $Nb_{2/3}$) occupying the B site was set at 0.05.

Among these samples 2 to 7, the A site was not occupied by Sr.

Although the molar amount x of Ca was 0.02 in sample 2, Sr was not present, so that the sum of the molar amounts (x+y) was as low as 0.02. For the same reason in sample 1, the sample collapsed with time after it was formed. Thus, the characteristics could not be measured.

In sample 7, the molar amount x of Ca was 0.25, which was excessively high. The Curie point Tc was 280° C., which was lower than 320° C., so that the sample may not withstand reflow heat treatment, in particular, lead-free solder reflow heat treatment. In this case, furthermore, the temperature coefficient of the resonant frequency |frTC| was 110 ppm/° C., which exceeded 75 ppm/° C. That is, the sample had reduced temperature characteristics.

In contrast, although the A site was not occupied by Sr in samples 3 to 6, the molar amount x of Ca was in the range of 0.05 to 0.20. The sum of the molar amounts (x+y) was in the range of 0.05 to 0.20, which was within the range of the present invention. The Curie point Tc was in the range of 340° C. to 420° C., i.e., it was possible to ensure a Curie point Tc of 320° C. or higher. Consequently, the samples could sufficiently withstand the reflow heat treatment. Furthermore, the temperature coefficient of the resonant frequency |frTC| was in the range of 5 to 47 ppm/° C., which was 75 ppm/° C. or less. Hence, satisfactory temperature characteristics were ensured. Moreover, the electromechanical coupling factor k was in the range of 32% to 40%, i.e. it was possible to ensure an electromechanical coupling factor k of 30% or more. The mechanical quality factor Qm was in the range of 59 to 65, i.e., it was possible to ensure a value of 45 or more. Consequently, the samples also had sufficient piezoelectricity for practical use.

In each of samples 3 and 4 in which the molar amount x of Ca was 0.05≦x≦0.15, the Curie point was as high as 380° C. to 420° C., and the temperature coefficient of the resonant frequency |frTC| could be reduced to less than 40 ppm/° C. It was thus possible to achieve more satisfactory temperature characteristics.

In each of samples 8 to 13, the A site was not occupied by Ca.

In sample 8, although the molar amount y of Sr was 0.02, Ca was not present, so that the sum of the molar amounts (x+y) was as low as 0.02. For the same reason as in sample 1, the sample collapsed with time after being formed. Thus, the characteristics could not be measured.

In sample 13, the molar amount y of Sr was 0.25, which was excessively high. The Curie point Tc was 280° C., which was lower than 320° C., so that the sample may not withstand reflow heat treatment, in particular, lead-free solder reflow heat treatment. Furthermore, the temperature coefficient of the resonant frequency |frTC| was as large as 80 ppm/° C. That is, the sample had reduced temperature characteristics.

In contrast, although the A site in samples 9 to 12 was not occupied by Ca, the molar amount y of Sr was in the range of 0.05 to 0.20. The sum of the molar amounts (x+y) was in the range of 0.05 to 0.20, which was within the range of the present invention. The Curie point Tc was in the range of 330° C. to 420° C., i.e., it was possible to ensure a Curie point Tc of 320° C. or higher. That is, the samples could sufficiently withstand the reflow heat treatment. Furthermore, the temperature coefficient of the resonant frequency |frTC| was in the range of 60 to 73 ppm/° C., which was 75 ppm/° C. or less. That is, satisfactory temperature characteristics were ensured. Moreover, the electromechanical coupling factor k was in the range of 34% to 36%, i.e. it was possible to ensure an electromechanical coupling factor k of 30% or more. The mechanical quality factor Qm was in the range of 45 to 60, i.e., it was possible to ensure a value of 45 or more. Consequently, the samples also had insufficient piezoelectricity for practical use.

In each of samples 9 and 10 in which the molar amount y of Sr was 0≦y≦0.15, the Curie point was as high as 390° C. to 420° C., and the temperature coefficient of the resonant frequency |frTC| could be reduced to less than 62 ppm/° C. It was thus possible to achieve more satisfactory temperature characteristics.

Each of samples 14 to 23 contained both Ca and Sr as the A-site components.

Although the molar amount of x of Ca was 0.02 in sample 14 and the molar amount y of Sr was 0.02, the sum of the molar amounts was as low as 0.04. For the same reason as in sample 1, the sample collapsed with time after formation. Thus, the characteristics could not be measured.

Meanwhile, the sum of the molar amounts (x+y) in each of samples 18, 21, and 25 was 0.25, which was excessively high. The Curie point Tc was in the range of 270° C. to 280° C., which was lower than 320° C., so that the sample may not withstand reflow heat treatment.

In contrast, the sum of the molar amounts (x+y) in samples 19, 20, and 22 was in the range of 0.15 to 0.20, which was within the range of the present invention. The Curie point Tc was in the range of 320° C. to 380° C., i.e., it was possible to ensure a Curie point Tc of 320° C. or higher. That is, the samples could withstand the reflow heat treatment. Furthermore, the temperature coefficient of the resonant frequency |frTC| was in the range of 10 to 35 ppm/° C., which was 75 ppm/° C. or less. That is, satisfactory temperature characteristics were ensured. Moreover, the electromechanical coupling factor k was in the range of 38% to 39%, i.e. it was possible to ensure an electromechanical coupling factor k of 30% or more. The mechanical quality factor Qm was in the range of 70 to 80, i.e., it was possible to ensure a Qm of 45 or more. Consequently, the samples also had sufficient piezoelectricity for practical use.

In each of samples 24 to 26, the molar amount x of Ca was 0.10, the molar amount y of Sr was 0.10, the sum of the molar amounts (x+y) was 0.20, and the molar amount z of ($Ni_{1/3}$ $Nb_{2/3}$) was 0.01. The firing temperatures were 1,100° C., 1,150° C., and 1,200° C.

In sample 24, the molar amount z of ($Ni_{1/3}Nb_{2/3}$) was as low (0.01). Sintering did not proceed sufficiently at a firing temperature of 1,100° C., so that the sintered density was low ($4.9 \times 10^3$ $kg/m^3$). As a result, the polarization treatment could not be performed because of a low insulation resistance; hence, characteristics could not be measured.

In sample 25, the firing temperature was increased to 1,150° C., but the sintered density was as low as $5.7 \times 10^3$ $kg/m^3$, not providing a dense sintered body. Thus, the electromechanical coupling factor k was low (13%). The sample had reduced piezoelectric properties.

In sample 26, the firing temperature was increased to 1,200° C., and the sintered density was high ($6.4 \times 10^3$ $kg/m^3$), providing a dense sintered body. Furthermore, characteristics such as the electromechanical coupling factor k, the mechanical quality factor Qm, the Curie point Tc, and the temperature coefficient of the resonant frequency |frTC| were satisfactory. In sample 26, however, since the firing temperature was as high as 1,200° C., the internal electrode needs an increase in the proportion of expensive Pd; hence, the problem of the present invention, i.e., the reduction in material cost, cannot be overcome.

The molar amount x of Ca was 0.1, the molar amount y of Sr was 0.1, the sum of the molar amounts (x+y) was 0.2 in samples 27 to 29, and the molar amount z of ($Ni_{1/3}Nb_{2/3}$) was changed.

In sample 29, the molar amount z of ($Ni_{1/3}Nb_{2/3}$) was 0.15, which was excessively high. Thus, the Curie point Tc was reduced to 250° C., which was lower than 320° C., so that the sample may not withstand reflow heat treatment.

In contrast, the molar amount z of ($Ni_{1/3}Nb_{2/3}$) was in the range of 0.02 to 0.10 in samples 27 and 28, which was within the range of the present invention. The Curie point Tc was in the range of 320° C. to 330° C., i.e., it was possible to ensure a Curie point Tc of 320° C. or higher. That is, the samples could sufficiently withstand the reflow heat treatment. Furthermore, the temperature coefficient of the resonant frequency |frTC| was in the range of 20 to 28 ppm/° C., which was 75 ppm/° C. or less. That is, satisfactory temperature characteristics were ensured. Moreover, the electromechanical coupling factor k was in the range of 38% to 40%, i.e. it was possible to ensure an electromechanical coupling factor k of 30% or more. The mechanical quality factor Qm was in the range of 65 to 64, i.e., it was possible to ensure a Qm of 45 or more. Consequently, the samples also had enough piezoelectricity for practical use.

Accordingly, where the molar amounts x, y, (x+y), and z satisfied $0 \leq x \leq 0.2$, $0 \leq y \leq 0.2$, $0.05 \leq x+y \leq 0.2$, and $0.02 \leq z \leq 0.1$, respectively, it was possible to co-fire the piezoelectric ceramic composition with an Ag—Pd alloy having a Ag content of 70% at a low temperature of about 1,100° C., ensure a Curie point Tc of 320° C. or higher, and sufficiently withstand the reflow heat treatment. The electromechanical coupling factor k was 30% or more, and the mechanical quality factor Qm was 45 or more. That is, it was possible to ensure satisfactory piezoelectricity. Furthermore, the temperature coefficient of the resonant frequency |frTC| was suppressed to 75 ppm/° C. or less. It was also possible to achieve satisfactory temperature characteristics.

EXAMPLE 2

In addition to the ceramic raw materials described in Example 1, $MnCO_3$ was prepared.

$Pb_3O_4$, $CaCO_3$, $SrCO_3$, $TiO_2$, NiO, and $Nb_2O_3$ were weighed in such a manner that the main component was $(Pb_{1-x-y}Ca_xSr_y)\{Ti_{1-z}(Ni_{1/3}Nb_{2/3})_z\}O_3$ (wherein x=0.00 or 0.10, y=0.00 or 0.10, and z=0.05). Furthermore, $MnCO_3$ was weighed to be in the range of 0.05 to 1.10 parts by weight with respect to 100 parts by weight of the main component.

Piezoelectric resonators of samples 31 to 36 were produced in the same way and procedure as in Example 1. A conductive paste with a ratio of the Ag content to the Pd content, i.e., a Ag/Pd weight ratio, of 7/3 was used. The co-firing temperature was 1,100° C.

For each of samples 31 to 36, the electromechanical coupling factor k in the longitudinal oscillation in the thickness direction, the mechanical quality factor Qm, the Curie point Tc, and the temperature coefficient of the resonant frequency |frTC| were measured as in the same way and procedure as in Example 1.

Table 3 shows compositions and firing temperatures of samples 31 to 36, and Table 4 shows the sample properties. In Tables 3 and 4, sample 20 in which $MnCO_3$ was not added is shown again. In these tables, samples marked with an asterisk (*) are outside the scope of the invention, and those marked with a double asterisk (**) are outside the scope of a preferred embodiment.

| | $(Pb_{1-x-y}Ca_xSr_y)\{Ti_{1-z}(Ni_{1/3}Nb_{2/3})_z\}O_3$ | | | | $MnCO_3$ (part per | Firing temperature |
|---|---|---|---|---|---|---|
| Sample | x | y | x + y | z | weight) | (° C.) |
| 31* | 0.00 | 0.00 | 0.00 | 0.05 | 0.50 | 1100 |
| 32 | 0.10 | 0.10 | 0.20 | 0.05 | 0.05 | 1100 |
| 33 | 0.10 | 0.10 | 0.20 | 0.05 | 0.10 | 1100 |
| 34 | 0.10 | 0.10 | 0.20 | 0.05 | 0.50 | 1100 |
| 35 | 0.10 | 0.10 | 0.20 | 0.05 | 1.00 | 1100 |
| 36** | 0.10 | 0.10 | 0.20 | 0.05 | 1.10 | 1100 |
| 20 | 0.10 | 0.10 | 0.20 | 0.05 | 0.00 | 1100 |

TABLE 4

| Sample | Sintered density ($\times 10^3$ kg/m$^3$) | Electrochemical coupling factor (%) | Mechanical quality factor Qm (-) | Curie point Tc (° C.) | Temperature coefficient of resonant frequency \| frTC \| (ppm/° C.) |
|---|---|---|---|---|---|
| 31* | | Unmeasurable | | | |
| 32 | 6.2 | 38 | 250 | 350 | 25 |
| 33 | 6.4 | 40 | 430 | 340 | 25 |
| 34 | 6.4 | 42 | 660 | 330 | 22 |
| 35 | 6.4 | 46 | 1020 | 330 | 30 |
| 36** | 6.4 | 31 | 55 | 320 | 28 |
| 20 | 6.1 | 39 | 75 | 320 | 10 |

In sample 31, the main composition was composed of PbTiO$_3$, although MnCO$_3$ was contained in the piezoelectric ceramic composition. For the same reason as in sample 1 in Example 1, after the sample was formed, it collapsed with time. Thus, the characteristics could not be measured.

In samples 32 to 36, the same main component composition of the piezoelectric ceramic composition and the same firing temperature were used. The samples had different MnCO$_3$ contents.

Comparisons of samples 32 to 35 with sample 20 clearly showed that the incorporation of 0.05 to 1.00 part by weight of MnCO$_3$ in the piezoelectric ceramic composition with respect to 100 parts by weight of the main component resulted in a significant increase in the mechanical quality factor Qm from 75 to 250 to 1,020, remarkably improving the mechanical quality factor Qm.

Like sample 36, however, a MnCO$_3$ content exceeding 1.0 part by weight with respect to 100 parts by weight of the main component reduced the mechanical quality factor Qm to a level lower than that of sample 20 in which MnCO$_3$ was not added.

That is, in the case where Mn is added, it is necessary to control the Mn content within 1.0 part by weight or less and preferably 0.05 to 1.0 part by weight with respect to 100 parts by weight of the main component. In this case, even when co-firing is performed at a low temperature of about 1,100° C., the mechanical quality factor Qm can be remarkably improved without deteriorating the electromechanical coupling factor k, the Curie point Tc, or the temperature coefficient of the resonant frequency |frTC|.

The invention claimed is:

1. A piezoelectric ceramic composition comprising a main component represented by general formula $\{(Pb_{1-x-y}Ca_xSr_y)\{Ti_{1-z}(Ni_{1/3}Nb_{2/3})_z\}O_3\}$, wherein $0 \leq x \leq 0.2$, $0 \leq y \leq 0.2$, $0.05 \leq x+y \leq 0.2$, $0.02 \leq z \leq 0.1$, and said main component has a Curie point of 320° C. or more.

2. The piezoelectric ceramic composition according to claim 1, wherein $0.05 \leq x \leq 0.15$, and $0 \leq y \leq 0.15$.

3. The piezoelectric ceramic composition according to claim 2 further comprising a Mn component in an amount of 1.0 part by weight or less, excluding zero, in terms of MnCO$_3$ with respect to 100 parts by weight of the main component.

4. The piezoelectric ceramic composition according to claim 3, wherein the Mn component is present in an amount of 0.05 to 1.0 part by weight in terms of MnCO$_3$ with respect to 100 parts by weight of the main component.

5. The piezoelectric ceramic composition according to claim 1 further comprising a Mn component in an amount of 1.0 part by weight or less, excluding zero, in terms of MnCO$_3$ with respect to 100 parts by weight of the main component.

6. The piezoelectric ceramic composition according to claim 5, wherein the Mn component is present in an amount of 0.05 to 1.0 part by weight in terms of MnCO$_3$ with respect to 100 parts by weight of the main component.

7. A piezoelectric element comprising a piezoelectric ceramic body, an internal electrode embedded in the piezoelectric ceramic body, and an external electrode arranged on the piezoelectric ceramic body, wherein the piezoelectric ceramic body comprises the piezoelectric ceramic composition according to claim 6.

8. The piezoelectric element according to claim 7, wherein the internal electrode comprises a Ag—Pd alloy.

9. A piezoelectric element comprising a piezoelectric ceramic body, an internal electrode embedded in the piezoelectric ceramic body, and an external electrode arranged on the piezoelectric ceramic body, wherein the piezoelectric ceramic body comprises the piezoelectric ceramic composition according to claim 5.

10. The piezoelectric element according to claim 9, wherein the internal electrode comprises a Ag—Pd alloy.

11. A piezoelectric element comprising a piezoelectric ceramic body, an internal electrode embedded in the piezoelectric ceramic body, and an external electrode arranged on the piezoelectric ceramic body, wherein the piezoelectric ceramic body comprises the piezoelectric ceramic composition according to claim 4.

12. The piezoelectric element according to claim 11, wherein the internal electrode comprises a Ag—Pd alloy.

13. The piezoelectric element according to claim 12, wherein the Ag—Pd alloy is predominately Ag.

14. A piezoelectric element comprising a piezoelectric ceramic body, an internal electrode embedded in the piezoelectric ceramic body, and an external electrode arranged on the piezoelectric ceramic body, wherein the piezoelectric ceramic body comprises the piezoelectric ceramic composition according to claim 3.

15. The piezoelectric element according to claim 14, wherein the internal electrode comprises a Ag—Pd alloy.

16. A piezoelectric element comprising a piezoelectric ceramic body, an internal electrode embedded in the piezoelectric ceramic body, and an external electrode arranged on the piezoelectric ceramic body, wherein the piezoelectric ceramic body comprises the piezoelectric ceramic composition according to claim 2.

17. The piezoelectric element according to claim 16, wherein the internal electrode comprises a Ag—Pd alloy.

18. A piezoelectric element comprising a piezoelectric ceramic body, an internal electrode embedded in the piezoelectric ceramic body, and an external electrode arranged on the piezoelectric ceramic body, wherein the piezoelectric ceramic body comprises the piezoelectric ceramic composition according to claim 1.

19. The piezoelectric element according to claim 18, wherein the internal electrode comprises a Ag—Pd alloy.

20. The piezoelectric element according to claim 19, wherein the Ag—Pd alloy is predominately Ag.

* * * * *